United States Patent [19]

Mueller et al.

[11] Patent Number: 4,501,993
[45] Date of Patent: Feb. 26, 1985

[54] DEEP UV LAMP BULB

[75] Inventors: Peter Mueller, Gaithersburg; Michael G. Ury, Bethesda; Charles H. Wood, Rockville, all of Md.

[73] Assignee: Fusion Systems Corporation, Rockville, Md.

[21] Appl. No.: 433,070

[22] Filed: Oct. 6, 1982

[51] Int. Cl.³ .................. H05B 41/16; H05B 41/24
[52] U.S. Cl. .................. 315/248; 313/636; 315/39
[58] Field of Search .......... 315/248, 267, 39; 313/573, 636, 639, 642, 607

[56] References Cited

U.S. PATENT DOCUMENTS

| 3,872,349 | 3/1975 | Spero et al. | 315/39 |
| 4,042,850 | 8/1977 | Ury et al. | 315/39 |
| 4,156,826 | 5/1979 | Hernqvist | 313/636 X |

OTHER PUBLICATIONS

Product Description of Suprasil-Suprasil W by Heraeus Amersil, Sayreville, N.J.
Catalogue of Thermal American Fused Quartz Co.-Vitreosil and Spectrosil-Montville, N.J.

Primary Examiner—Saxfield Chatmon
Attorney, Agent, or Firm—Pollock, Vande Sande & Priddy

[57] ABSTRACT

An electrodeless lamp bulb for producing relatively high radiation output in the deep ultraviolet part of the spectrum when excited with microwave energy wherein the bulb envelope is made of synthetic quartz which is substantially water-free. This results in increased bulb lifetime, since loss of bulb transparency with exposure to deep ultraviolet radiation over time is substantially reduced. An electrodeless lamp incorporating the above-described bulb includes a microwave chamber in which the bulb is situated and means for coupling microwave energy to the chamber.

2 Claims, 7 Drawing Figures

DEEP UV LAMP BULB

The present invention is directed primarily to an improved lamp bulb for a deep ultraviolet light source and also to a source which incorporates the improved bulb.

An important use for deep ultraviolet (deep UV) light sources presently is in the practice of semiconductor photolithography. In conventional UV photolithography, a pattern in a optical mask, which corresponds to the features of an integrated circuit to be manufactured is imaged onto a semiconductor wafer which has been coated with a UV sensitive photoresist with ultraviolet light at conventional wavelengths (260–460 nm). After the pattern is exposed on the wafer, it undergoes further processing, and ultimately results in a transistor device or integrated circuit.

In order to produce integrated circuits of greater component densities, it is necessary to image patterns having narrower lines on the semiconductor substrate than can be effected with conventional ultraviolet light, and thus sources which produce deep ultraviolet (210–240 nm) have been proposed, and to a certain extent utilized. An improved deep UV source, which utilizes an electrodeless type bulb, is disclosed in copending U.S. application Ser. Nos. 362,825 and 381,481, assigned to the same assignee as the present application.

As with other types of light sources, it is desired for the bulb which produces the deep UV radiation to have as long a useful lifetime as is possible. This results in having to change the bulb less frequently and consequently in less down time for the equipment involved. Since photolithography equipment is normally deployed on a production line, down time is an important consideration in the overall production capability of the system.

The lamp which is presently most widely used for producing deep UV radiation is the Xe-Hg compact arc lamp, which utilizes a bulb having electrodes therein along with a fill comprised of a mixture of Hg and Xe. Due to the presence of the electrodes, which sputter material onto the envelope wall during operation, the effective lifetime of such bulbs is typically limited to only about 100–200 hours.

Electrodeless light sources for producing conventional ultraviolet radiation typically have longer lifetimes, and in general this is one of the advantages of this type of source. However, it has been found that the emission of radiation in the deep UV part of the spectrum presents unique problems with respect to bulb lifetime. In the design of a deep UV source, when the teachings associated with electrodeless lamps emitting conventional UV wavelengths were applied to deep UV lamps, only a marginal lifetime was obtained, which led to the the development of the present invention.

More particularly, in the prior art, the envelopes of ultraviolet-emitting bulbs are made of a material known as commercial quartz, which is a term of art for water-containing commercially processed natural quartz, a material which in general is reputed to be UV-transparent. However, it was found that when this material is used for deep UV lamps, the transmission of the envelope at deep UV wavelengths falls off sharply with time. This problem is actually so serious that about a 10% attenuation in deep UV output occurs for each 100 hours of operating time, resulting in a useful lifetime of only about 100–200 hours for such bulbs. This is to be contrasted with electrodeless lamps emitting at conventional UV wavelengths, for example such lamps manufactured by the assignee of the present application, which have a useful lifetime of from 2000–4000 hours.

In work done to solve this problem it was discovered by applicants that when the bulb envelope is made of quartz which substantially water-free, a dramatic increase in deep UV transmission over time, and consequently in bulb lifetime, results. Thus, it has been determined that bulbs made in accordance with the present invention, having envelopes of water-free quartz, experience deep UV attenuation of only approximately 1% per hundred hours of operating time, resulting in a bulb which has an effective lifetime of approximately 1000 hours. This dramatic result was not predictable from available data, which indicates that water-free quartz has an absorption band at 260 nm, and that quartz from which the water has not been removed has slightly better deep UV transmission at time zero, ostensibly making such water-free quartz less rather than more suitable for deep UV transmission.

It is thus an object of the invention to provide an improved deep UV lamp bulb.

It is a further object of the invention to provide a deep UV lamp bulb having a relatively long operational lifetime.

It is a further object of the invention to provide a deep UV lamp bulb having an envelope which transmits deep UV wavelengths effectively over sustained periods of time.

It is a further object of the invention to provide a deep UV light source which requires bulbs to be changed relatively infrequently, resulting in less down time for the source and for the system in which it is employed.

The invention will be better understood by referring to the accompanying drawings in which.

Figure 1:
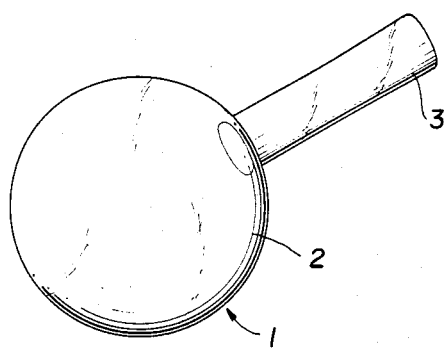
FIG. 1 is a schematic representation of an embodiment of an electrodeless lamp bulb.

Referring to FIG. 1, electrodeless lamp bulb 1 is depicted, and is shown being attached to mounting stem 3. Lamp bulb 1 consists of envelope 2 of spherical or other shape, which contains a fill comprised primarily of mercury, a noble gas, and a substance such as HgCl which serves to keep the plasma off the envelope wall during operation.

Figure 6:
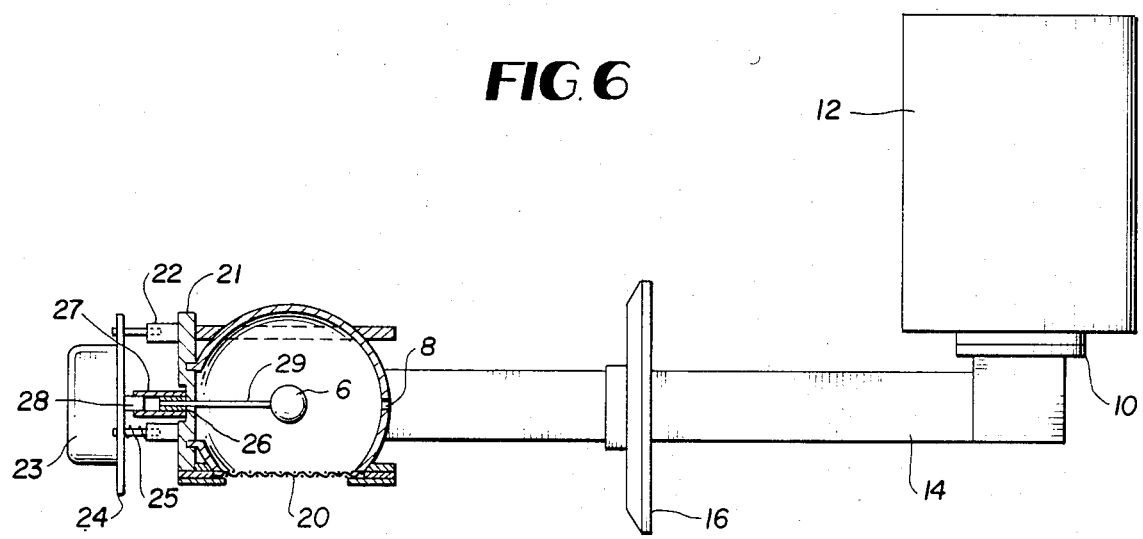
FIG. 6 is a schematic representation of an embodiment of a light source using the improved bulb of the invention.
Figure 7:
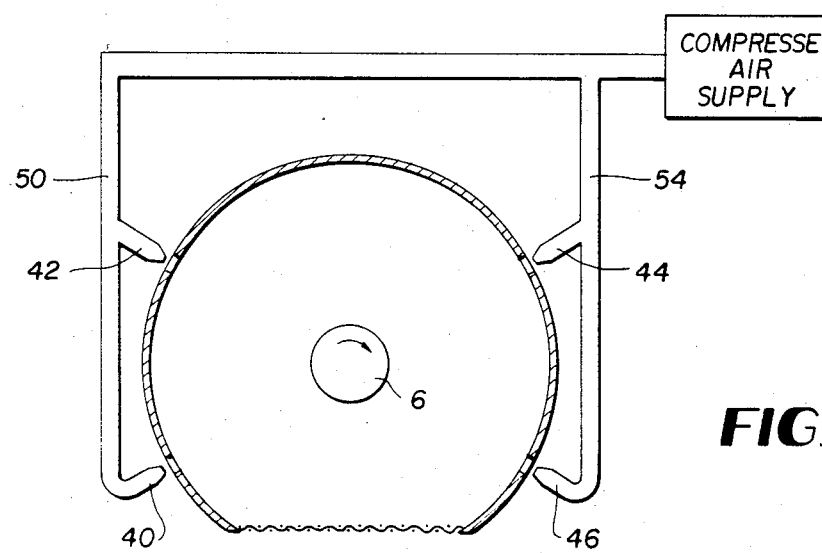
FIG. 7 is a schematic representation of the cooling system used with the source of FIG. 4.

When microwave energy is coupled to the bulb, the mercury heats up and forms a plasma, which emits ultraviolet light. In a light source for performing deep UV photolithography, a bright output which is high in the deep UV part of the spectrum is required, and the mercury fill and power density of microwave energy coupled to the fill are arranged to provide such an output. An illustrative embodiment of a complete light source having the above characteristics is described in connection with FIGS. 6 and 7.

Figure 2:
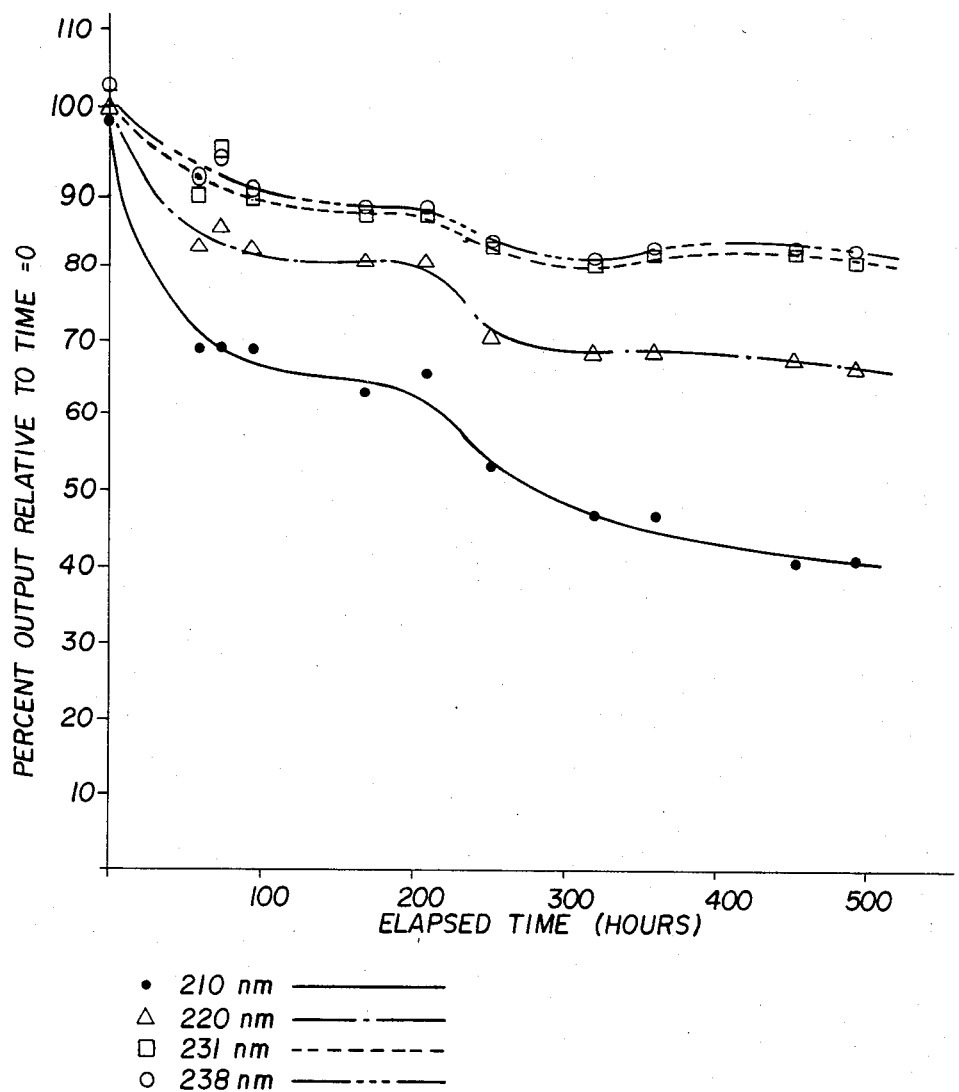
FIG. 2 is a graph of deep UV output versus hours of operation for a lamp bulb having an envelope made of commercial quartz.

As discussed above, when the envelope 2 of the lamp bulb of FIG. 1 is made of commercial quartz, the deep UV output has been found to fall steeply during operation. In this regard, FIG. 2 is a graph of deep UV output at 210, 220, 231 and 238 nm as a function of hours of operation, and it will be observed that use of the this quartz results in deep UV attenuation of approximately 10% per 100 hours, with the result that the bulb has a total operational lifetime of only about 200 hours. The actual commercial quartz used in the life-test depicted in FIG. 2 was General Electric Type 214A, having water therein.

"Commercial" quartz is a term of art for quartz which is commercially manufactured from naturally occurring crystalline quartz, and it is the type of material which is normally used for the envelopes of ultraviolet lamps including arc lamps, low pressure mercury vapor lamps, and electrodeless lamp. For example, linear electrodeless lamps made by the assignee of the present application with commercial quartz have been found to have operational lifetimes of approximately 2000–4000 hours.

Although not understood, it is believed that the poor performance of the water-containing commercial quartz at deep UV wavelengths is due to a change in the molecular structure of the quartz which is caused by exposure to deep UV over long periods of time. Commercial quartz is chemically $SiO_2$, but also includes trace amounts of metallic impurities as well as water. It is believed that the existence or the water as well as of the metallic impurities in the amounts present may result in the degradation of the deep UV transmission characteristic over time. Type 214 quartz manufactured by General Electric Company and type T08 commercial manufactured by Heraeus-Amersil, Inc. are typical commercial quartzes and contain more than 52 parts per million of metallic impurities and an OH content of approximately 180 parts per million respectively.

Figure 3:
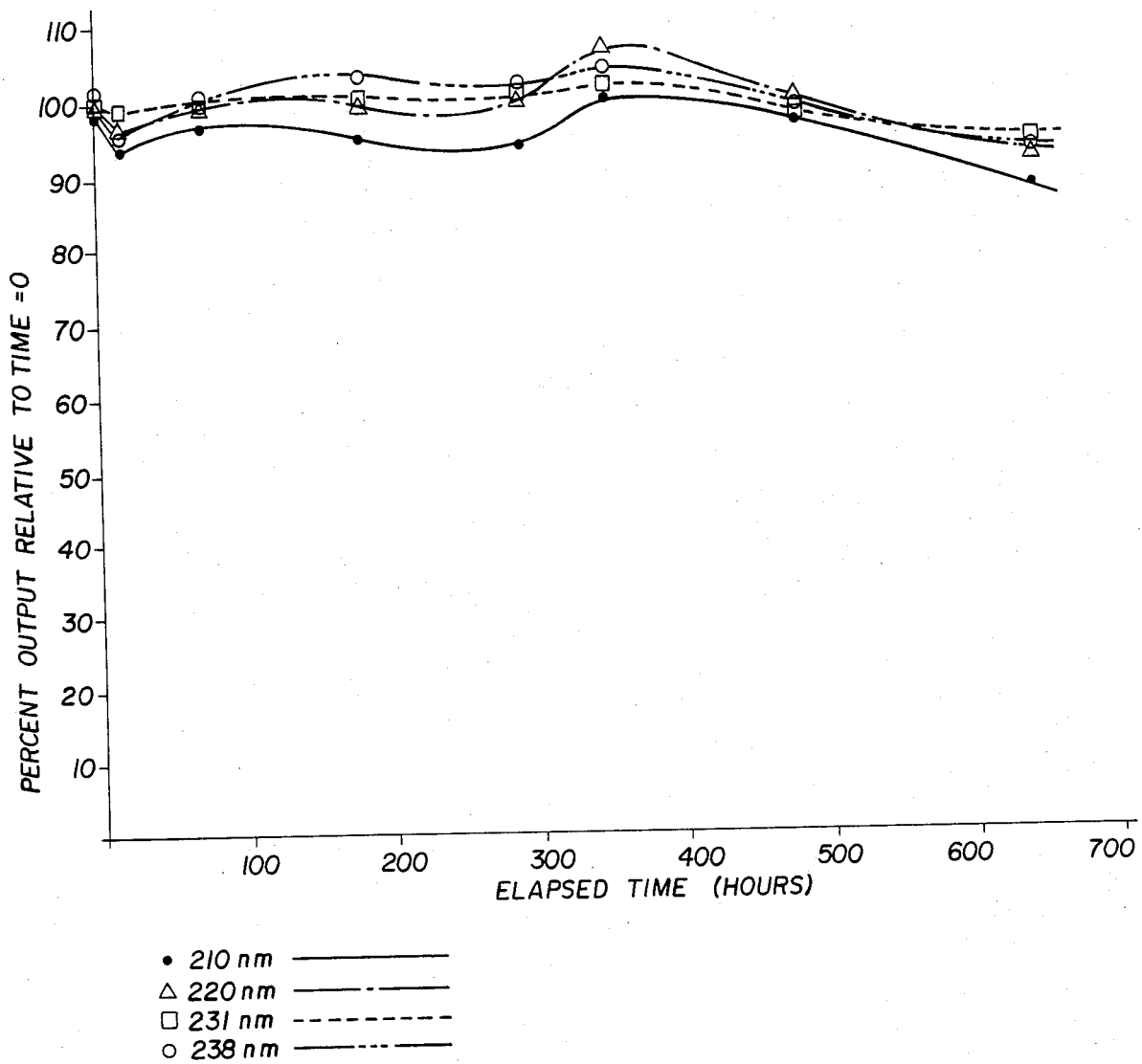
FIG. 3 is a graph of deep UV output versus hours of operation for a lamp bulb in accordance with the present invention.

A graph of deep UV output vs. hours of operation for a bulb in accordance with the present invention having an envelope of a substantially water-free synthetic quartz is depicted in FIG. 3. It should be observed that a dramatic increase in deep UV transmission is obtained in comparison to the lamp using a commercial quartz. Thus, with the bulb of the invention, the loss in deep UV transmission is only about 1% per 100 hours (except at 210 nm), which is a tenfold improvement over the results illustrated in FIG. 2. The operational lifetime of a bulb in accordance with the invention is believed to be approximately 500–1000 hours, and when the light source is used for deep UV photolithography this represents a substantial improvement over presently used Xe-Hg compact arc lamps, which have a lifetime of only about 100–200 hours.

The improved results, while not completely understood, are believed to be due to the fact that the water free quartz is utilized. Most preferably, the quartz employed is water-free synthetic quartz which is also lower in metallic impurities than commercial quartz. It should be understood that the term "synthetic quartz" as used herein means quartz which is made synthetically as opposed to being processed from naturally occurring quartz. It is significant to note that when synthetic quartz not having the water removed (e.g., containing about 600 ppm $H_2O$) was used, the results were not favorable as the bulbs visibly darkened after a short period of exposure to deep UV radiation.

This is the first application of water-free synthetic quartz to lamp envelopes of which applicant is aware. It is understood that the reason that such quartz is manufactured is because elimination of the water reduces the infrared absorption band normally present in synthetic quartz. Thus, heretofore this quartz has been used in applications where high IR transmission has been required such as in certain scientific instruments and for fiber-optic cable.

Figure 4:
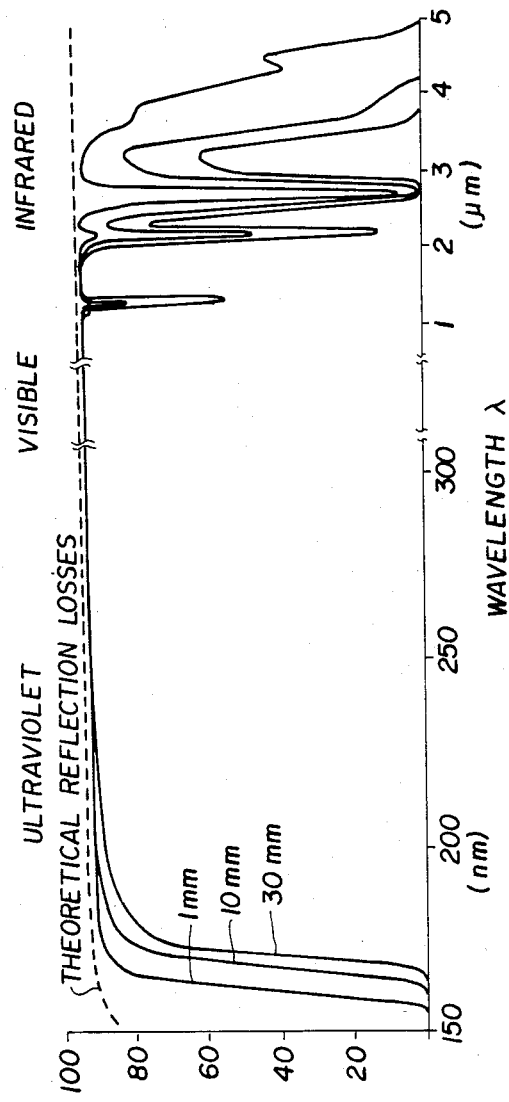
FIGS. 4 and 5 are the initial transmission characteristics for synthetic quartz and synthetic water-free quartz respectively.
Figure 5:
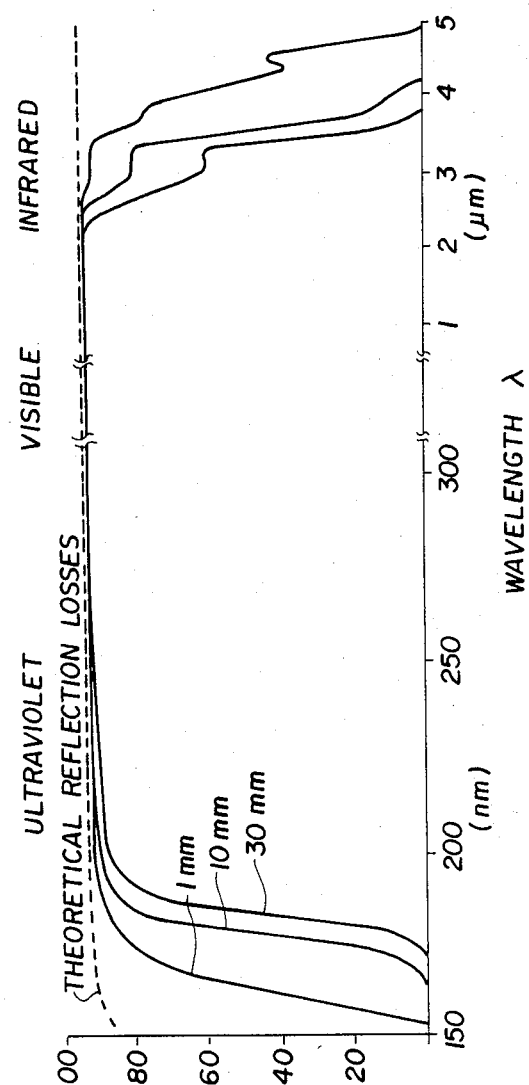

Actually, the available data would appear to predict that synthetic quartz with water as opposed to water-free quartz would be the preferred material for deep UV in general, as published data indicates that the water-free quartz has an absorption band at 260 nm and that synthetic quartz with water has a slightly better initial deep UV transmission characteristic. In part this, as well as the infra-red transmission of water-free quartz, which up to now has apparently dictated its usefulness are shown in FIGS. 4 and 5, which are initial transmission characteristics for synthetic quartz and synthetic water-free quartz respectively, sold under the trademarks Suprasil and Suprasil-W (water-free). Thus, the dramatically improved deep UV lifetime results which have been achieved with the water-free quartz were not anticipated.

In order to be suitable for use in the invention the quartz utilized should be represented by the manufacturer as being water-free, as such products will be substantially water-free. For example, Suprasil-W has an extremely low water content of only about 2.5 parts per million. Examples of available quartz materials which may be used are the above-mentioned Suprasil-W sold by Heraeus-Amersil Inc., Sayerville, N.J. and Spectrosil-WF, sold by Thermal American Fused Quartz Company. For the purpose of completeness, a range of the impurities which are found in these materials are listed at the end of the specification.

Referring to FIG. 4, an embodiment of a microwave generated light source in which the improved lamp bulb of the invention may be utilized, is illustrated. The light source is comprised of microwave chamber 4 and electrodeless lamp bulb 6, which is disposed in the chamber. The lamp bulb envelope is arranged to have a maximum dimension which is substantially smaller than a wavelength of the microwave energy utilized to excite the plasma in the bulb, and chamber 4 has a slot 8 for efficiently coupling microwave energy to the bulb.

The microwave energy is supplied by magnetron 10 which is activated by a power supply 12, and the microwave energy generated by the magnetron is fed through rectangular waveqide section 14 tunable by tuning stub 16, to the slot 8 in microwave chamber 4.

The interior of chamber 4 is coated with a UV reflective material and the chamber has an opening 18 for allowing deep ultraviolet radiation which is emitted by the lamp bulb to pass out of the chamber. The opening is covered with metallic mesh 20 which is substantially transparent to the emitted ultraviolet radiation, but substantially opaque to the microwave energy within the chamber.

For advantageous results, the chamber is arranged to be near-resonant, but not resonant as calculated for an ideal chamber without a bulb present. It has been found that a condition of near-resonance results in maximum coupling of energy to the small bulb 6, and consequently maximum light output therefrom. In order to maximize coupling, the chamber is arranged to be near-resonant at a single wavelength rather than at a multiple of wavelengths, which facilitates efficient absorption of the microwave energy. The relative positioning of the slot 8 and opening 18 shown in FIG. 4 provide a relatively uniform UV output through mesh 20.

In order to provide a bright output at deep UV wavelengths, the power density coupled to the bulb must be at higher than conventional power density levels, and the fill must contain a critical volumetric ratio of mercury. More specifically, the power density coupled to the bulb should be in excess of about 250 watts/cc, and, as described in greater detail in copending U.S. application Ser. No. 433,069, the mercury in the bulb should be in a range of from 0.5–0.9 µl per ml of bulb volume at room temperature (72° F.).

It will be appreciated that the high power density at which the lamp is operated causes the surface of the quartz envelope of bulb 6 to become extremely hot. In order to suitably cool the envelope, a cooling system is employed wherein the envelope is rotated while a plurality of jets of cooling gas are directed at it.

Referring to FIG. 4, it will be seen that lamp envelope 6 has a stem 29 which is rotated by motor 23. The motor shaft is connected to stem 29 via a mechanical coupler so that the stem is effectively an extension of the motor shaft, and in FIG. 4 a mechanical configuration using flange 21, motor mounting flange 24, and spacing posts 22 is illustrated.

FIG. 5 shows the system for directing cooling gas at the envelope as it rotates, and is seen to depict nozzles 40, 42, 44, and 46, which are fed by compressed air supply 38. The nozzles are directed approximately at the center of the envelope and combine with the rotation to provide a substantial cooling effect. In the embodiment illustrated all of the nozzles are located in a plane which passes through the center of the sphere. However, with bulbs having a diameter of 1 inch or larger, more effective cooling may be obtained if the nozzle 40 is offset slightly to one side of the chamber center plane while nozzle 42 is offset slightly to the other side, and similarly for nozzles 44 and 46.

In an actual embodiment of the light source shown in FIG. 1, metallic chamber 2 is a 3.9 inch diameter sphere having a 2.8 inch circular opening 18 which is covered by mesh 20. Mesh 20 is a grid of 0.0017 inch diameter wires having a spacing of 0.033 inches between wire centers. Spherical lamp envelope 4 is 18.5 mm interior diameter and is filled with 2.1 µl of Hg, and argon at 90 torr, and additionally may include a small amount of HgCl at about 0.1 mg.

Magnetron 10 provides about 1500 watts of microwave power at a frequency 2450 Mhz, and a major part of this power is coupled to the plasma, resulting in a power density of approximately 400 watts/cc. The resulting light source has a conversion efficiency in the deep UV part of the spectrum of about 8%, and is a bright source which radiates at about 190 watts/cc.

As mentioned above, for the sake of completeness, a table which lists the range of impurities of presently commercially available synthetic water-free quartzes follows:

| ELEMENT | PPM BY WEIGHT | ELEMENT | PPM BY WEIGHT |
| --- | --- | --- | --- |
| Aluminum | 0.02–.1 | Molybdenum | <0.03 |
| Antimony | <0.001–.002 | Nickel | <0.4 |
| Arsenic | <0.001–.03 | Niobium | <0.05 |
| Barium | <0.03 | Osmium | <0.05 |
| Beryllium | not determined | Palladium | <0.02 |
| Bismuth | 0.01 | Phosphorus | <0.01–.1 |
| Boron | 0.01–.02 | Platinum | <0.03 |
| Bromine | <0.03 | Potassium | 0 to .005 |
| Cadmium | <0.02 | Rare Earths | <0.03 |
| Caesium | <0.007 | Rhenium | <0.02 |
| Calcium | <0.1–.7 | Rhodium | <0.005 |
| Cerium | <0.007 | Rubidium | <0.004 |
| Chlorine | up to 180 | Ruthenium | <0.05 |
| Chromium | 0.02 | Scandium | <0.07 |
| Cobalt | 0.0001 | Selenium | <0.17 |
| Copper | <0.003–0.004 | Silver | 0 to .05 |
| Gallium | 0.001 | Sodium | 0.004–.04 |
| Germanium | 0.12 | Strontium | <0.04 |
| Gold | 0.0001 | Sulphur | <0.16 |
| Hafnium | <0.04 | Tellurium | <0.02 |
| Indium | <0.006 | Thallium | <0.02 |
| Iodine | <0.007 | Thorium | <0.01 |
| Iridium | <0.03 | Tin | <0.02 |
| Iron | <0.02 | Titanium | 0–.1 |
| Lanthanum | <0.007 | Tungsten | <0.03 |
| Lead | <0.06 | Uranium | <0.01 |
| Lithium | 0–.05 | Vanadium | 0.008 |
| Mangesium | <0.1 | Yttrium | <0.04 |
| Manganese | 0.006–.01 | Zinc | 0.02 |
| Mercury | <0.03 | Zirconium | 0–0.15 |

There thus has been disclosed an improved deep UV lamp bulb as well as a light source in which said bulb may be employed.

It should be appreciated that while the invention has been disclosed in connection with electrodeless lamp bulbs, it may find use in deep UV lamps having electrodes as well. Additionally, other variations which fall within the scope of the invention may occur to those skilled in the art, and the invention is limited only by the claims appended hereto and equivalents.

What is claimed is:

1. An electrodeless lamp bulb for producing relatively high radiation output in the deep ultraviolet part of the spectrum (210–240 nm) when excited with microwave energy wherein loss of bulb transparency with exposure to deep ultraviolet radiation over time is substantially reduced, thereby increasing the useful lifetime of the bulb comprising,
   an electrodeless bulb envelope made of synthetic quartz which is substantially water free, and
   a fill in said envelope which emits said deep ultraviolet radiation upon being excited with said microwave energy.

2. A microwave generated electrodeless lamp for producing relatively high output in the deep UV part of the spectrum (210–240 nm) having an electrodeless lamp bulb wherein loss of bulb transparency with exposure to said deep UV radiation over time is substantially reduced, resulting in substantially increased bulb lifetime and the requirement that the bulb can be changed only relatively infrequently, resulting in minimal lamp down time, comprising,
   means for generating microwave energy,
   an electrodeless lamp bulb comprised of an envelope which is filled with a plasma forming medium, which when excited emits radiation in the deep UV part of the spectrum (210–240 nm), and
   means for coupling said generated microwave energy to said bulb to excite said plasma and cause said deep UV radiation to be generated, and wherein,
   said lamp envelope is made of substantially water-free synthetic quartz.

* * * * *